US009223702B2

(12) United States Patent
Hsueh et al.

(10) Patent No.: US 9,223,702 B2
(45) Date of Patent: *Dec. 29, 2015

(54) SYSTEMS AND METHODS FOR READ CACHING IN FLASH STORAGE

(71) Applicant: HGST Technologies Santa Ana, Inc., Santa Ana, CA (US)

(72) Inventors: Po-Jen Hsueh, Kaohsiung (TW); Richard A. Mataya, Rancho Santa Margarita, CA (US); Mark Moshayedi, Newport Coast, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,077

(22) Filed: Aug. 11, 2014

(65) Prior Publication Data

US 2014/0351498 A1 Nov. 27, 2014

Related U.S. Application Data

(63) Continuation of application No. 12/779,003, filed on May 12, 2010, now Pat. No. 8,806,144.

(60) Provisional application No. 61/177,601, filed on May 12, 2009.

(51) Int. Cl.
| *G06F 12/00* | (2006.01) |
| *G06F 13/00* | (2006.01) |
| *G06F 12/08* | (2006.01) |
| *G06F 12/10* | (2006.01) |
| *G11C 16/34* | (2006.01) |
| *G06F 11/07* | (2006.01) |
| *G06F 12/02* | (2006.01) |

(52) U.S. Cl.
CPC .......... *G06F 12/0833* (2013.01); *G06F 11/076* (2013.01); *G06F 12/0246* (2013.01); *G06F 12/0284* (2013.01); *G06F 12/0866* (2013.01); *G06F 12/1009* (2013.01); *G11C 16/3418* (2013.01); *G06F 2212/2022* (2013.01); *G06F 2212/466* (2013.01); *G06F 2212/62* (2013.01); *G06F 2212/7208* (2013.01); *G06F 2212/7209* (2013.01); *G11C 16/349* (2013.01)

(58) Field of Classification Search
None
See application file for complete search history.

(56) References Cited

U.S. PATENT DOCUMENTS

| 5,434,982 | A  | 7/1995 | Calzi |
| 5,745,789 | A  | 4/1998 | Kakuta |
| 6,266,759 | B1 | 7/2001 | Birrittella |
| 6,345,001 | B1 | 2/2002 | Mokhlesi |
| 6,725,342 | B1 | 4/2004 | Coulson |
| 6,788,605 | B2 | 9/2004 | Sharma et al. |
| 7,091,740 | B2 | 8/2006 | Simons |

(Continued)

*Primary Examiner* — Sean D Rossiter
(74) *Attorney, Agent, or Firm* — McDermott Will & Emery LLP (57) ABSTRACT

A flash controller receives a read request for reading a page of data from the flash memory from a host system, and identifies, in a cache tag table stored in the random access memory, a virtual unit address associated with the page of data. In response to identifying the virtual unit address in the cache tag table, controller determines whether a valid tag line for the page of data is associated with the virtual unit address in the cache tag table. In response to determining that the valid tag line is associated with the virtual unit address in the cache tag table, the controller reads the page of data from the random access memory in accordance with the read request and returns the read data to the host system.

20 Claims, 4 Drawing Sheets

(56) References Cited

U.S. PATENT DOCUMENTS

| | | |
|---|---|---|
| 7,467,337 B2 | 12/2008 | Nakamura et al. |
| 7,610,438 B2 | 10/2009 | Lee et al. |
| 7,707,354 B2 | 4/2010 | Lee et al. |
| 7,818,525 B1 | 10/2010 | Frost et al. |
| 7,859,932 B2 | 12/2010 | Mokhlesi |
| 7,864,579 B2 | 1/2011 | Gutsche et al. |
| 7,929,372 B2 | 4/2011 | Han et al. |
| 8,010,739 B2 | 8/2011 | Watanabe et al. |
| 8,074,011 B2 | 12/2011 | Flynn et al. |
| 8,189,379 B2 | 5/2012 | Camp et al. |
| 8,281,220 B2 | 10/2012 | Kitahara |
| 2002/0166022 A1 | 11/2002 | Suzuki |
| 2004/0221128 A1 | 11/2004 | Beecroft et al. |
| 2005/0251617 A1 | 11/2005 | Sinclair et al. |
| 2007/0124531 A1 | 5/2007 | Nishihara |
| 2008/0001958 A1 | 1/2008 | Vembu et al. |
| 2008/0177937 A1 | 7/2008 | Nishihara et al. |
| 2008/0288814 A1 | 11/2008 | Kitahara |
| 2009/0125671 A1 | 5/2009 | Flynn et al. |
| 2009/0132876 A1 | 5/2009 | Freking et al. |
| 2009/0172254 A1 | 7/2009 | Chen |
| 2009/0193174 A1 | 7/2009 | Reid |
| 2009/0216936 A1 | 8/2009 | Chu et al. |
| 2009/0265503 A1 | 10/2009 | Hung et al. |
| 2009/0282187 A1 | 11/2009 | Ito et al. |
| 2010/0064095 A1* | 3/2010 | Chen et al. ............ 711/103 |
| 2010/0070735 A1* | 3/2010 | Chen et al. ............ 711/206 |
| 2010/0100665 A1 | 4/2010 | Lin |
| 2010/0107021 A1 | 4/2010 | Nagadomi et al. |
| 2010/0122148 A1 | 5/2010 | Flynn et al. |
| 2010/0161886 A1 | 6/2010 | Toelkes et al. |
| 2010/0185806 A1 | 7/2010 | Pruthi et al. |
| 2011/0038203 A1 | 2/2011 | Camp et al. |
| 2011/0161557 A1 | 6/2011 | Haines et al. |

* cited by examiner

SYSTEMS AND METHODS FOR READ CACHING IN FLASH STORAGE

The present application is a continuation of U.S. patent application Ser. No. 12/779,003 entitled "Flash Storage Device with Read Cache," filed on May 12, 2010, which claims the benefit of priority under 35 U.S.C. §119 from U.S. Provisional Patent Application Ser. No. 61/177,601 entitled "Read Disturb Mitigation," filed on May 12, 2009, the disclosures of which are hereby incorporated by reference in their entirety for all purposes.

BACKGROUND

The present disclosure concerns flash storage devices and, more particularly, flash storage devices configured to mitigate read disturb errors.

Flash memory comprises an array of memory cells. Each memory cell includes a floating gate transistor that is used to store one or more bits of data. The floating gate transistor in a memory cell is programmed by placing an amount of charge on the floating gate, which increases the threshold voltage of the transistor. To read the memory cell, a read voltage above the threshold voltage of an unprogrammed transistor and below the threshold voltage of a programmed transistor is applied to the control gate of the transistor. An unprogrammed transistor will conduct at the read. voltage, while a programmed transistor will not. By sensing conduction with the read voltage applied, the programmed state of the transistor may be read.

NAND flash memory is organized into strings of transistors. Each string includes multiple transistors linked together by connecting the source of one transistor to the drain of an adjacent transistor. The strings of transistors typically are organized into physical blocks, each physical block comprising a number of pages. The transistors within a string correspond to different respective p in a physical block. A page is read out of a physical block by applying a read voltage to the control gate of the transistor corresponding to the particular page in each string of the physical block. During a read operation, the other transistors in the strings are operated in a conducting state by placing a voltage at or above the threshold voltage of a programmed transistor on the respective control gates.

Repeated read operations to a physical block may generate bit errors in one or more pages within the physical block. As noted above, transistors not being read are operated in a conducting state during a read operation. The voltage applied to these transistors may transfer a small amount of charge to the transistors' floating gates. After a number of read operations, the cumulative amount of transferred charge may cause a previously unprogrammed transistor to be incorrectly read as a programmed transistor. These errors, referred to as read disturb errors, may result in data loss within physical blocks containing frequently read pages unless the flash memory is managed to mitigate read disturb errors and the potential data toss associated with these errors.

SUMMARY

The subject technology mitigates read disturb errors in a flash storage device using a read cache to reduce the number of read operations executed in flash memory. The read cache is organized based on virtual unit addresses, which are mapped to physical blocks in the flash memory, and virtual page addresses, which are mapped to physical pages in the flash memory. The virtual unit addresses and virtual page addresses are mapped from logical addresses used by a host system in read requests. Cache tags are organized into a tag table based on virtual unit addresses and a tag sub-table for each of the virtual unit addresses in the tag table. Replacement policies are used to update the tag table and each of the tag sub-tables. Organizing the read cache based on virtual units and page addresses allows the operation of the flash storage device to be managed to reduce repeated read operations executed in physical blocks of the flash memory.

According to one aspect of the subject technology, a method of managing a flash storage device is described. The method includes storing, in a first memory, copies of data read from a flash memory in the flash storage device, mapping a logical address in a read request received from a host system to a virtual unit address and a virtual page address, and checking a virtual unit cache tag table stored in the first memory based on the virtual unit address. If a hit is found in the virtual unit cache tag table, a virtual page cache tag sub-table stored in the first memory is checked based on the virtual page address, wherein the virtual page cache tag sub-table is associated with the virtual unit address. If a hit is found in the virtual page cache tag sub-table, data stored in the first memory mapped to the hit in the virtual page cache tag sub-table is read in response to the read request received from the host system.

According to another aspect of the subject technology, a flash storage device is described. The flash storage device includes a first memory, a flash memory comprising a plurality of physical blocks, each of the plurality of physical blocks comprising a plurality of physical pages, and a controller. The controller is configured to store, in the first memory, copies of data read from the flash memory, map a logical address in a read request received from a host system to a virtual unit address and a virtual page address, and check a virtual unit cache tag table stored in the first memory based on the virtual unit address. If a hit is found in the virtual unit cache tag table, a virtual page cache tag sub-table stored in the first memory is checked based on the virtual page address, wherein the virtual page cache tag sub table is associated with the virtual unit address in the virtual unit cache tag table. If a hit is found in the virtual page cache tag sub-table, data stored in the first memory mapped to the hit in the virtual page cache tag sub-table is read in response to the read request received from the host system.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Figure 1:
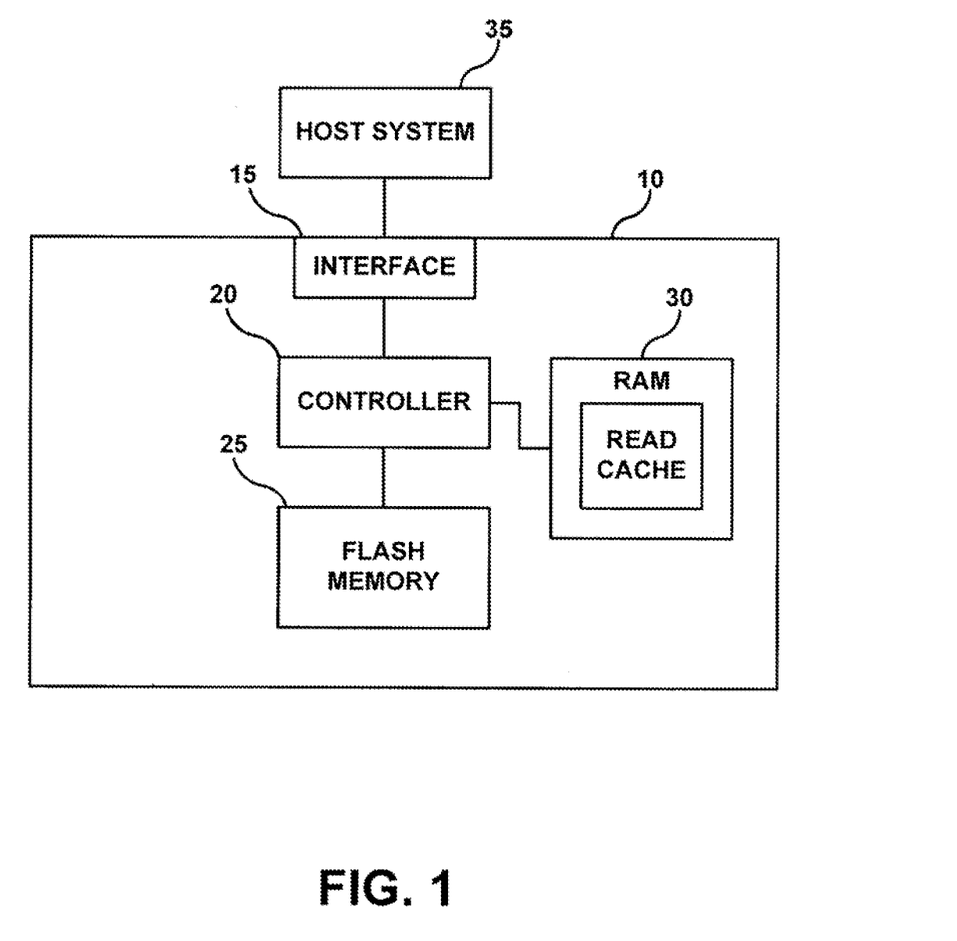
FIG. 1 is a block diagram illustrating components of a flash storage device according to one aspect of the subject technology.

FIG. 1 is a block diagram illustrating components of a flash storage device 10 according to one aspect of the subject technology. As depicted in FIG. 1, flash storage device 10 includes interface 15, controller 20, flash memory 25, and random access memory (RAM) 30. Interface 15 facilitates communication of data, commands, and/or control signals between flash storage device 10 and host system 35. Controller 20 controls the operation of flash storage device 10 to store and retrieve data in flash memory 25 in accordance with commands received from host system 35. RAM 30 provides temporary storage space for controller 20 to process commands and transfer data between host system 35 and flash memory 25. The operation of each of these components is described in more detail below.

Interface 15 provides physical and electrical connections between host system 35 and flash storage device 10. Interface 15 is configured to facilitate communication of data, commands, and/or control signals between host system 35 and flash storage device 10 via the physical and electrical connection. The connection and the communications with interface 15 may be based on a standard interface such as Universal Serial Bus (USB), Small Computer System Interface (SCSI), Serial Advanced Technology Attachment (SATA), etc. Alternatively, the connection and/or communications may be based on a proprietary interface. Those skilled in the art will recognize that the subject technology is not limited to any particular type of interface.

Controller 20 manages the transfer of data between host system 35 and flash memory 25. Controller 20 is coupled to interface 15 and is configured to receive commands and data from host system 35 via interface 15. For example, controller 20 may receive data and a write command from host system 35 to write the data in flash memory 25. Controller 20 is further configured to send data to host system via interface 5. For example, controller 20 may read data from flash memory 25 and send the data to host system 35 in response to a read command. Controller 20 is further coupled to flash memory 25 and RAM 30 and is configured to manage data stored in flash memory 25 and RAM 30 based an internal control algorithms and commands received from host system 35. Those skilled in the art will be familiar with conventional operations, such as read, write and erase, performed by a controller in a flash storage device, which will not be described in detail herein.

Controller 20 may be implemented with a general purpose processor, micro-controller, digital signal processor (DSP), an application specific integrated circuit (ASIC), a field programmable gate array (FPGA) or other programmable logic device, a discrete gate or transistor logic device, discrete hardware components, or any combination thereof designed and configured to perform the operations and functions described herein. Controller 20 may perform the operations and functions described herein by executing one or more sequences of instructions stored on a machine/computer readable medium. The machine/computer readable medium may be flash memory 25, RAM 30, or other types of readable media from which controller 20 can read instructions or code. For example, flash storage device 10 may include a read only memory (ROM), such as an EPROM or EEPROM, encoded with firmware/software comprising one or more sequences of instructions read and executed by controller 20 during the operation of flash storage device 10.

Flash memory 25 represents one or more flash memory devices. The one or more flash memory devices all may be located on a single flash chip or arranged on multiple flash chips. The flash memory devices may be split and coupled to controller 20 via multiple channels through which data is transferred or coupled to controller 20 via a single channel. Flash memory 25 may be implemented using NAND flash, which as discussed above may result in read disturb data errors with frequent read accesses.

Flash memory 25 comprises multiple memory cells divided into storage or physical blocks. These physical blocks may be referred to as data blocks or memory blocks and are addressable by controller 20 using a physical block address. Each of the physical blocks is further divided into multiple data segments or physical pages addressable by controller 20 using a physical page address or an offset from a physical block address of the physical block containing the referenced physical page. The physical blocks represent units of data that are erased within flash memory 25 during a single erase operation. The physical pages represent units of data that are read from or written to flash memory 25 in a single read/write operation. Those skilled in the art may recognize other terminology conventionally used to refer to these data units within flash memories.

The subject technology is not limited to any particular capacity of flash memory. For example, each physical block may comprise 32, 64, or 128 physical pages. Additionally, each physical page may comprise 512 bytes, 2 Kbytes, 4 Kbytes, or 8 Kbytes.

RAM 30 represents a first memory coupled to and used by controller 20 during operation of flash storage device 10. The first memory may have quicker access times than flash memory 25 and may be volatile memory, such as DRAM. Controller 20 may buffer commands and/or data in RAM 30. Controller 20 also may use RAM 30 to store address translations tables used to convert logical data addresses used by host system 35 into virtual addresses, and virtual address into physical addresses in flash memory 25. As discussed in more detail below, controller 20 is configured to manage and store a read cache in RAM 30. Other types of tables, data, status indicators, caches, etc. conventionally used to manage flash storage devices also may be stored in RAM 30 by controller 20. RAM 30 may be implemented using dynamic random access memory (DRAM), static random access memory (SRAM), or other types of random access memory known to those skilled in the art without departing from the scope of the subject technology.

As noted above, flash storage device 10 receives commands from host system 35 via interface 15, which are subsequently processed and executed by controller 20. The commands may include read commands, write commands, erase commands, etc. Host system 35 uses logical addresses to identify the data being read, written, or erased in flash memory 25. Controller 20 maps the logical addresses to virtual addresses, which are subsequently mapped, to physical addresses in flash memory 25. The virtual addresses may include a virtual unit address and a virtual page address within the addressed virtual unit. A virtual unit address is mapped to a corresponding physical block address in flash memory 25, and a virtual page address is mapped to a corresponding physical page address within the addressed physical block in flash memory 25. Controller 20 stores and maintains address mapping tables containing the mapping from logical address to virtual address and from virtual address to physical address. Controller 20 may maintain this mapping information in a single mapping table or divide the information among multiple mapping tables. Controller 20 may store the mapping tables in RAM 30. In addition, controller 20 may back up the mapping tables into flash memory 25 at various times during operation of flash storage device 10, including at power down of the device.

To reduce the number of read operations performed in flash memory 25, and thereby reduce the occurrence of read disturb errors, controller 20 maintains a read cache in RAM 30. Specifically, a copy of data that is read from flash memory 25 is stored in a read cache in RAM 30 and tagged using the virtual address mapped to the physical address of the location in hash memory 25 storing the data. Subsequent read commands requesting data stored in the read cache are processed using the data in the read cache rather than executing another read operation in flash memory 25. The structure and management of the read cache is described in more detail below.

Figure 2:
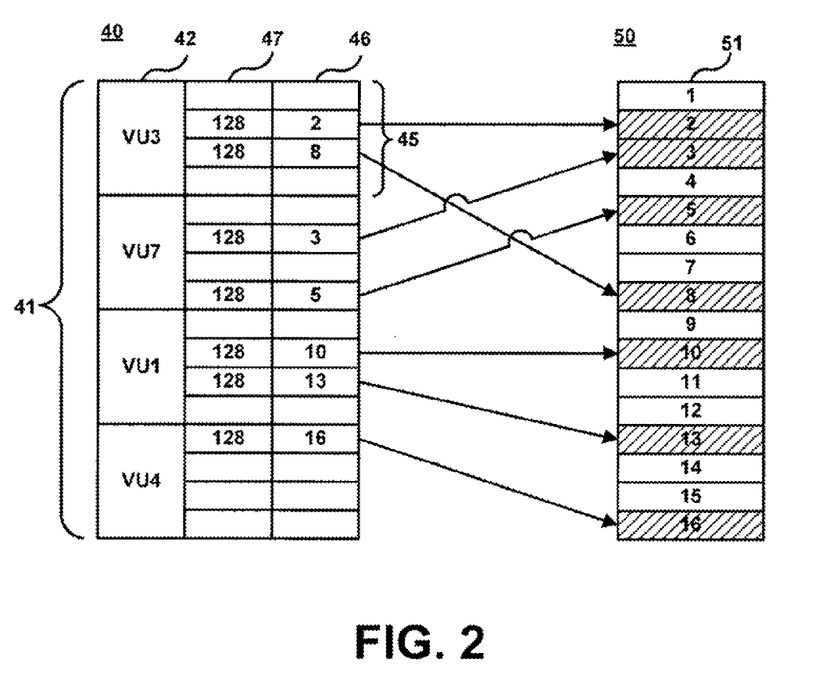
FIG. 2 is a diagram illustrating the configuration of a read cache in a flash storage device according to one aspect of the subject technology.

FIG. 2 is diagram depicting the arrangement of a read cache managed and stored in RAM 30 by controller 20 according to one aspect of the subject technology. As shown in FIG. 2, the read cache comprises cache tag tables 40 and cache line data 50. The first column of cache tag tables 40 depicted in FIG. 2 represents a virtual unit cache tag table 41 comprising tags 42 containing virtual unit addresses for the virtual units currently having data mapped in the read cache. For example, the first tag 42 contains virtual unit address VU3, the second tag 42 contains virtual unit address VU7, the third tag 42 contains virtual unit address VU1, and the fourth tag contains virtual unit address VU4.

Virtual unit cache tag table 41 depicted in FIG. 2 contains four tags 42 containing four virtual unit addresses, respectively. Those skilled in the art will recognize that the number of tags in virtual unit cache tag table 41 may be greater than four or less than four without departing from the scope of the subject technology. The number of tags in virtual unit cache tag table 41 is configurable. For example, the number of tags may be set based on the amount of available memory in RAM 30, the specification of flash storage device 10, applications and/or systems in which flash storage device 10 may be used optimization using one or more benchmarks, etc. According to one aspect of the subject technology, the default number of tags in virtual unit cache tag table 41 is 75.

Cache tag tables 40 also include a virtual page cache tag sub-table 45 for each virtual unit address in virtual unit cache tag table 41. The virtual page cache tau sub-table 45 may include a tag line for each virtual page within a virtual unit. Controller 20 may be configured to hold eight physical pages in reserve from each physical block containing 64 total physical pages. The reserved physical pages may be used for wear-leveling processes, to replace defective physical pages within the physical block, etc. The virtual unit mapped to the physical block may have 56 virtual pages mapped to the 56 physical pages, respectively, remaining in the physical block. The tag lines in the virtual page cache tag sub-table 45 are indexed using the virtual page address within the virtual unit. FIG. 2 depicts virtual page cache tag sub-tables 45 with four tag lines each to simplify the figure for purposes of describing concepts of the subject technology. Those skilled in the art will recognize that the number of tag lines in virtual page cache tag sub-tables 45 may vary depending on the number of pages in each block/unit as well as the number of physical pages held in reserve by controller 20.

Each tag line in virtual page cache tag sub-tables 45 includes two bit fields. Bit field 46 contains an address/index value for mapping the virtual unit and virtual page corresponding to the tag line to data stored in cache hue data 50. FIG. 2 shows the second tag in the virtual page cache tag sub-table 45 for tag 42 containing virtual unit address VU3 as being mapped to the second cache line Si in cache line data 50. Similarly, the third tag in the virtual page cache tag sub-table 45 for tag 42 containing virtual unit address VU3 is shown as being: mapped to the eighth cache line 51 in cache line data 50.

Bit field 47 comprises bits used to store administrative data. For example, bit field 47 may indicate the number of valid sectors or total sectors in the mapped cache line in cache line data 50. For example, valid tag lines depicted in FIG. 2 are shown containing the number 128, which indicates that the mapped cache line data. comprises 128 sectors. Bit field 47 also may indicate whether the mapped cache line is dirty for use with write policies, or may be used for tracking the age of a mapped cache line for use with replacement policies. The subject technology is not limited to any particular number of bits in bit field 47 or particular uses for the bits in bit field 47. Those skilled in the art will recognize other information that may be stored and. communicated using bit field 47 without departing from the scope of the subject technology.

Cache line data 50 includes multiple cache lines 51 used to store data read from flash memory 25. The size of each cache line 51 is configurable. According one aspect of the subject technology, each cache line Si contains an amount of data equivalent to one page (e.g., 64 Kbytes). In addition, the number of cache lines 51 in cache line data 50 is configurable. FIG. 2 depicts 16 cache lines 51 in cache line data 50 for purposes of describing the subject technology. Those skilled in the art will recognize that the number of cache lines 51 may vary depending on the available memory in RAM 30 and the size of each cache line as well as design specifications for a particular flash storage device.

According to one aspect of the subject technology, cache line data 50 is fully associative with the tags in cache tag table 40. In particular, any of the tags in cache tag table 40 may be mapped to any of the cache lines Si in cache line data 50. The subject technology is not limited to this configuration and may be implemented using direct mapping or N-way set associative mapping without departing from the scope of the subject technology.

Figure 3:
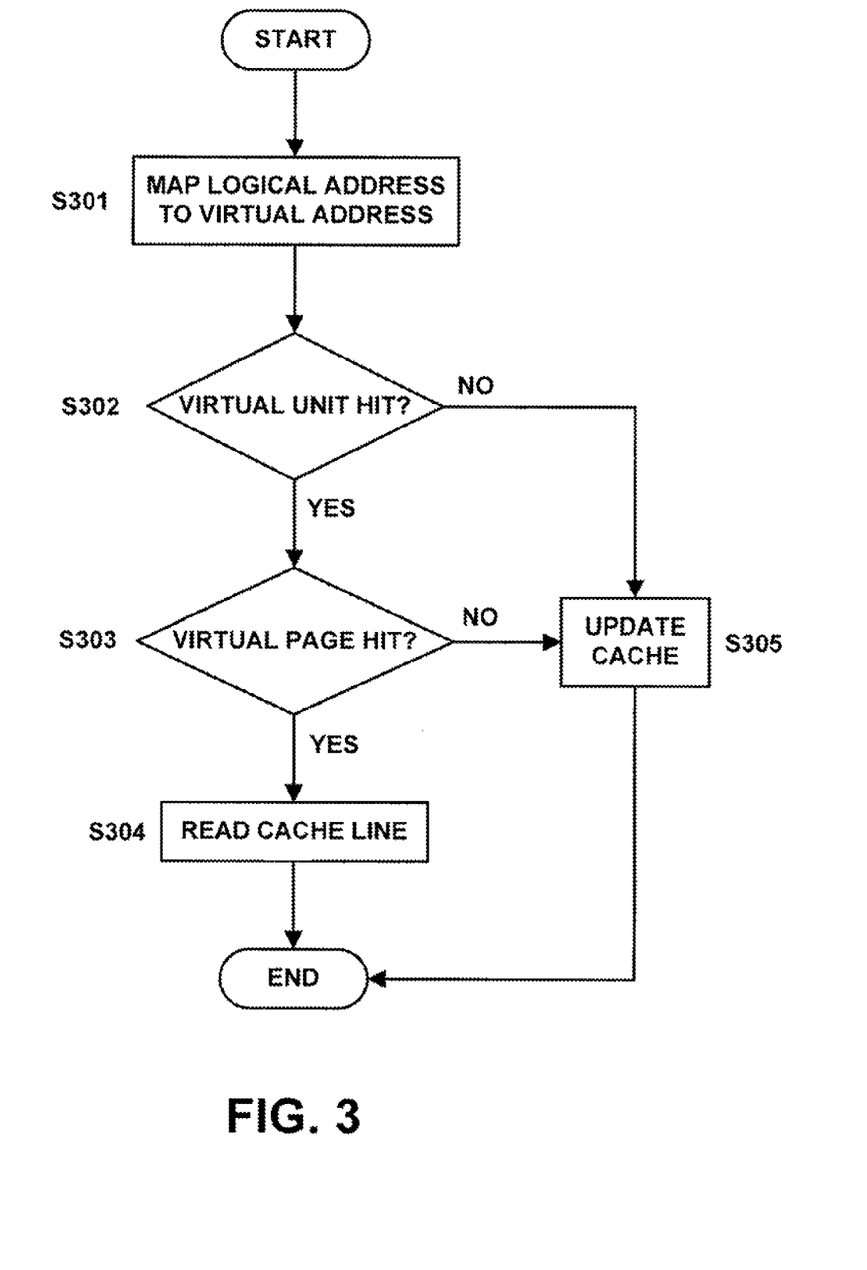
FIG. 3 is a flowchart illustrating a method for managing a flash storage device according to one aspect of the subject technology.

FIG. 3 is a flowchart illustrating a process/method for managing a flash storage device according to one aspect of the subject technology. The process starts when flash storage device 10 receives a read request from host system 35. In step S301, controller 20 maps the logical address included in the read request from host system 35 to a virtual unit address and a virtual page address containing the requested data. In step S302, controller 20 checks the virtual unit cache tag table 41 to determine if a tag containing the virtual address exists in the table. If a hit in the virtual cache unit cache tag table 41 is found the process proceeds to step S303 where the virtual page cache tag table 45 associated with the virtual unit address is checked using the virtual page address. If a hit in the virtual page cache tag table 45 is found, the process proceeds to step S304 where the requested data is read from the cache line mapped from the tag found in the virtual page cache tag table 45.

For example, a logical address received from host system 35 may be mapped to the second virtual page within the virtual unit addressed as VU7. Referring to FIG. 2, virtual unit cache tag table 41 is checked (step S302) and a tag 42 containing the virtual unit address VU7 is found. The associated virtual page cache tag table 45 is checked (step S303) using the virtual page address to identify the tag line and a valid tag line is found with an address/index mapping to the third cache line in cache line data 50. The data is read from the third cache line (step S304) in response to the read request from host system 35.

Figure 4:
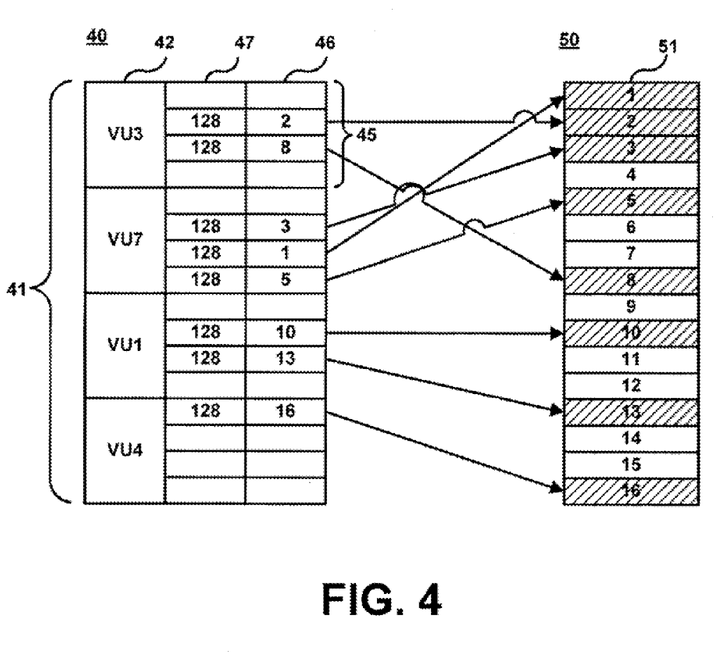
FIG. 4 is a diagram illustrating the configuration of an updated read cache in a flash storage device according to one aspect of the subject technology.

If a hit is not found in the virtual page cache tag table 45 in step S303, the process proceeds to step S305 wherein the read cache is updated. For example, a logical address received from host system 35 in a read request may be mapped to the third virtual page within the virtual unit addressed as VU7. Referring again to FIG. 2, the corresponding tag line in the virtual page cache tag table 45 for VU7 is empty or invalid and therefore a cache miss occurs. The read cache is updated by reading the requested data from the physical address in flash memory 25 corresponding to the mapped virtual address and storing the read data in an available cache line. The tag line corresponding to the virtual address is then updated to map to the cache line containing the data. Referring to FIG. 4, the data is written into the first cache line and the tag line in the virtual page cache tag table 45 corresponding to VU7 is updated to map to the first cache line and to reflect that 128 sectors are stored in that cache line. Controller 20 may transfer the data read from flash memory 25 in response to the read request from host system 35 or may transfer the data from the newly written cache line in cache line data 50 in response to the read request.

Each cache line may have the capacity to store a page of data read from flash memory 25. In the event that the read request received from host system 35 is for less than a page of data, the entire page, or pages, of data containing the requested data may be copied into the read cache.

According to one aspect of the subject technology, the mapping to the cache lines is fully associative thereby allowing any tag line to be mapped to any available cache line. When the read cache is updated, the first available cache line in cache line data 50 may be used to store the new data read from flash memory 25. For example, as discussed above with respect to FIG. 4, the data read from flash memory 25 was stored in the first cache line, which was previously empty. Those skilled in the art will recognize that other mapping techniques may be used for determining which cache line new data should be written without departing from the scope of the subject technology.

As discussed above, the number of tag lines in the virtual page cache tag table 45 associated with a particular virtual unit address may be equal to the total number of virtual pages within the virtual unit. According to one aspect of the subject technology, the number of valid tag lines within a single virtual page cache tag table 45 may be capped at a number less than the total number of virtual pages. For example, each virtual page cache tag table 45 may be limited to eight valid tag lines mapped to cache lines in cache line data 50. If data corresponding to a ninth virtual page within a particular virtual unit is read, the tag line of one of the existing virtual pages must be invalidated once this threshold value of nine is reached to allow the data corresponding to the ninth virtual page to be added to the read cache. The tag line may be invalidated by clearing the bit fields or changing a status in the bit fields to indicate the invalid status of the tag line. The tag line to be invalidated may be selected according to a replacement policy, such as least recently used (LRU). The subject technology is not limited to any particular replacement policy.

Returning to FIG. 2, if a hit is not found in the virtual unit cache tag table 41 in step S302, the process proceeds to step S305, where the read cache is updated. The read cache is updated in a manner similar to that described above in which the new data is written to an available cache line and the cache line is mapped to the tag line corresponding to the virtual page containing the new data. Unlike the process described above, however, the virtual unit cache tag table 41 must be updated to add a tag 42 containing the virtual unit address of the new data, and an associated virtual page cache tag table 45 must be added before the mapping can be indicated in the tag tables.

As noted above, the total number of tags 32 in the virtual unit cache tag table 41 is limited to a specified number. For example, the virtual unit cache tag table 41 may comprise up to 75 tags 42. Referring to FIG. 2, which shows four tags 42 in the virtual unit cache tag table 41, if the new data being added to the read cache is from a fifth virtual address not currently in the table, one of the tags 42, and the associated virtual page cache tag table 45, must be removed from the tables to make room for a new tag 42 with the fifth virtual unit address and an associated virtual page cache tag table 45. The number five represents a threshold value in this example for when a tag 42 must be removed. The virtual address removed from the tables may be selected according to a replacement policy, such as least recently used (LRU). The subject technology is not limited to any particular replacement policy.

The foregoing examples have discussed situations where replacement policies may be used to invalidate or remove tag lines when a threshold number of virtual pages within a given virtual unit being cached is reached, or when a threshold number of virtual units having one or more virtual pages with cached data is reached, in the event that there are no available cache lines available for newly read data, but neither a threshold number of virtual units nor a threshold number of virtual pages within any of the virtual units is reached, a replacement policy may be used to select a cache line to empty and use to store the newly read data. The subject technology is not limited to any particular replacement policy for selecting the cache line. The replacement policy may be applied across all of the cache lines, such as the least recently used cache line of any cache line regardless of the mapped virtual address associated with the cache line. A first replacement policy may be applied at the virtual unit level, such as the least recently used virtual unit, and than a second replacement policy may be applied to select one of the virtual pages with that virtual unit, if necessary.

Controller 20 may further manage the read cache to account for any write operations that change the data currently stored in one or more of the cache lines. In this regard, controller 20 may check the virtual address of a write request against the tag tables to determine if data being modified is currently stored in the read cache. If data being modified in a write request is stored in the read cache, controller 20 may invalidate the tag line(s) for the virtual addresses corresponding to the data and wait for the first read request for the new data before updating the read cache with the new data. Alternatively, controller 20 may update the cache line(s) to contain the data from the write request before or after writing the data to the mapped physical address in flash memory 25. If the amount of data being written is less than the capacity of a single cache line, controller 20 may read data from the locations surrounding the location of the newly written data to fill the cache line. The subject technology is not limited to any particular write policy for updating the read cache to account for write operations.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the an to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded, the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine arid neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such a configuration may refer to one or more configurations and vice versa.

The word "exemplary" is used herein to mean "serving as an example or illustration." Any aspect or design described herein as "exemplary" is riot necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of managing a flash storage device, the method comprising:
   receiving a read request for reading a page of data from a non-volatile memory;
   identifying, in a cache tag table stored in a cache memory different from the non-volatile memory, a virtual unit address associated with the page of data;
   in response to identifying the virtual unit address in the cache tag table, determining whether, in a sub-table of the cache tag table, a valid tag line for the page of data is associated with the virtual unit address, the valid tag line indicating that the page of data includes valid data; and
   in response to determining that the valid tag line is associated with the virtual unit address in the cache tag table, reading the page of data from the cache memory in accordance with the read request.

2. The method of claim 1, wherein the cache tag table comprises a plurality of sub-tables for locating virtual pages stored in the cache memory based on respective virtual page addresses, each sub-table being associated with a respective virtual unit address.

3. The method of claim 1, wherein the valid tag line is indexed by a virtual page address for the page of data.

4. The method of claim 1, further comprising, in response to not determining that the valid tag line is associated with the virtual unit address in the cache tag table:
   reading the page of data from the non-volatile memory;
   storing the page of data in the cache memory; and
   associating the valid to line with the virtual unit address in the cache tag table.

5. The method of claim 1, wherein a maximum number of valid tag lines associated with a respective virtual unit address in the cache tag table is less than a total number of virtual pages in a virtual unit corresponding to the virtual unit address.

6. The method of claim 5, further comprising:
   when the maximum number of valid tag lines are associated with the respective virtual unit address, invalidating one or more of the valid tag lines before associating another valid tag line with the respective virtual unit address.

7. The method of claim 6, wherein invalidating one or more of the valid tag lines comprises invalidating a tag line associated with a least recently used virtual page address.

8. The method of claim 1, further comprising:
   determining if a valid tag line for a virtual page address associated with a write command is in the cache tag table;
   in response to determining the valid tag line for the virtual page address associated with the write command is in the cache tag table, invalidating the valid tag line for the virtual page address.

9. The method of claim 1, further comprising:
   writing one or more new pages of data to the non-volatile memory;
   writing the one or more new pages of data to the cache memory; and associating valid tag lines for the one or more new pages of data with a corresponding virtual unit address in the cache tag table.

10. The method of claim 1, further comprising:
mapping a host logical address in the read request to the virtual it address and a virtual. page address for the page of data.

11. A system, comprising:
a random access memory;
a flash memory comprising a plurality of physical blocks, each of the plurality of physical blocks comprising a plurality of physical pages;
a controller, wherein the controller is configured to:
receive a read request for reading a page of data from the flash memory;
identify, in a cache tag table stored in the random access memory, a virtual unit address associated with the page of data;
in response to identifying the virtual unit address in the cache tag table, determine whether, in a sub-table of the cache tag table, a valid tag line for the page of data is associated with the virtual unit address, the valid tag line being indexed by a virtual page address for the page of data and indicating that the page of data includes valid data; and
in response to determining that the valid tag line is associated with the virtual unit address in the cache tag table, read the page of data from the random access memory in accordance with the read request.

12. The system of claim lit wherein the cache tag table comprises a plurality of sub-tables for locating virtual pages stored in the random access memory based on respective virtual page addresses, each sub-table being associated with a respective virtual unit address.

13. The system of claim 11, wherein the controller is further configured to, in response to not determining that the valid tag line is associated with the virtual unit address in the cache tag table:
reading the page of data from the flash memory;
storing the page of data in the random access memory; and
associating the valid tag line with the virtual unit address in the cache tag table.

14. The system of claim 1, wherein a maximum number of valid tag lines associated with a respective virtual unit address in the cache tag table is less than a total number of virtual pages in a virtual unit corresponding to the virtual unit address.

15. The system of claim 14, wherein the controller is further configured to:
when the maximum number of valid tag lines are associated with the respective virtual unit address, invalidating one or more of the valid tag lines before associating another valid tag line with the respective virtual unit address.

16. The system of claim 15, wherein invalidating one or more of the valid tag lines comprises invalidating a tag line associated with a least recently used virtual page address.

17. The system of claim 11, wherein the controller is further configured to:
determining if a valid tag line for a virtual page address associated with a write command is in the cache tag table;
in response to determining the valid tag line for the virtual page address associated with the write command is in the cache tag table, invalidating the valid tag line for the virtual page address.

18. The system of claim 11, wherein the controller is further configured to:
writing one or more new pages of data to the flash memory;
writing the one or more new pages of data to the random access memory; and
associating valid tag lines for the one or more new pages of data with a corresponding virtual unit address in the cache tag table.

19. A flash controller, comprising non-transitory instructions stored therein that, when executed by the controller, perform the operations of:
receiving a read request for reading a page of data from a one or more flash memory devices;
identifying, in a cache tag table stored in a cache memory different from the flash memory, a virtual unit address associated with the page of data;
in response to identifying the virtual unit address in the cache tag table, determining whether, in a sub-table of the cache tag table, a valid tag line for the page of data is associated with the virtual unit address, the valid tag line being indexed by a virtual page address for the page of data and indicating that the page of data includes valid data; and
in response to determining that the valid tag line is associated with the virtual unit address in the cache tag table, reading the page of data from the cache memory in accordance with the read request.

20. The flash controller of claim 19, wherein the cache tag table comprises a plurality of sub-tables for locating virtual pages stored in the cache memory based on respective virtual page addresses, each sub-table being associated with a respective virtual unit address.

* * * * *